United States Patent
Hamon

(10) Patent No.: US 10,001,522 B2
(45) Date of Patent: Jun. 19, 2018

(54) METHOD FOR PREDICTING FAILURE OF A LIGHT-EMITTING DIODE

(71) Applicant: Commissariat A L'Energie Atomique et aux Energies Alternatives, Paris (FR)

(72) Inventor: Benoit Hamon, Bree (FR)

(73) Assignee: Commissariat A L'Energie Atomique et aux Energies Alternatives, Paris (FR)

(*) Notice: Subject to any disclaimer, the term of this patent is extended or adjusted under 35 U.S.C. 154(b) by 16 days.

(21) Appl. No.: 14/874,548

(22) Filed: Oct. 5, 2015

(65) Prior Publication Data
US 2016/0109507 A1   Apr. 21, 2016

(30) Foreign Application Priority Data

Oct. 15, 2014 (FR) .................................. 14 59905

(51) Int. Cl.
G01R 31/26 (2014.01)
H05B 33/08 (2006.01)
H05B 37/03 (2006.01)

(52) U.S. Cl.
CPC ..... *G01R 31/2635* (2013.01); *H05B 33/0893* (2013.01); *H05B 37/03* (2013.01)

(58) Field of Classification Search
CPC ......................... G01R 31/2635; G01R 31/27
See application file for complete search history.

(56) References Cited

U.S. PATENT DOCUMENTS

| 6,147,617 | A | 11/2000 | Kim |
| 2007/0040696 | A1 | 2/2007 | Mubaslat et al. |
| 2009/0192735 | A1* | 7/2009 | Horiuchi ............... H01S 5/0021 702/58 |
| 2010/0121593 | A1* | 5/2010 | McElfresh ......... G01R 31/2635 702/64 |
| 2012/0290241 | A1 | 11/2012 | Nguyen et al. |

FOREIGN PATENT DOCUMENTS

| EP | 2 523 008 A1 | 11/2012 |
| WO | WO 2007/022409 A2 | 2/2007 |

OTHER PUBLICATIONS

Preliminary Search Report dated Jun. 11, 2015 in French Patent Application No. FR 1459905.

* cited by examiner

*Primary Examiner* — Noam Reisner
(74) *Attorney, Agent, or Firm* — Oblon, McClelland, Maier & Neustadt, L.L.P.

(57) ABSTRACT

A method for predicting failure of a light-emitting diode, includes applying a test potential difference across the terminals of the light-emitting diode lower than its minimum drive potential difference, the test potential difference having the same sign as the minimum drive potential difference; measuring the current $I_c$ flowing through the light-emitting diode during the application of the test potential difference; and generating an alarm signal when the measured current $I_c$ exceeds an alarm threshold $I_a$.

10 Claims, 4 Drawing Sheets

METHOD FOR PREDICTING FAILURE OF A LIGHT-EMITTING DIODE

The invention relates to light-emitting diode lighting and in particular to methods allowing failure of such lighting to be anticipated.

Because of its recognized advantages in terms of energy efficiency, compactness and lifetime, light-emitting diode or LED lighting technology is currently experiencing rapid commercial growth. Light-emitting diode lighting is therefore particularly preferred for light sources that are difficult to replace, for example traffic lights, street lighting or car headlights.

As with most other types of light sources, the luminosity of light-emitting diodes degrades with age. In the aforementioned applications, preventive actions are generally carried out before complete failure of light-emitting diodes. However, such preventive replacement implies changing a certain number of light-emitting diodes that still have a relatively long lifetime, in order to make allowance for the worst performing diodes. Moreover, it would be desirable to be able to determine directly on a manufacturing line faulty light-emitting diodes in order to be able to scrap them immediately. Thus, there is a need for an alarm signal to be generated when the remaining lifetime of a light becomes relatively short.

A first known method for anticipating failure of a light consists in measuring the illumination of the light-emitting diodes by means of an external optical sensor. However, such a method requires additional components that are difficult to integrate into a light-emitting diode substrate and that thus induce a quite substantial additional cost. In addition, such a method must itself be extremely reliable in order to ensure that the measured changes are due to degradation of the LED and not to degradation of the measurement system. The applications of such a method are therefore relatively limited. Moreover, the measurements of such light sensors may be corrupted if they receive a light flux originating from other light-emitting diodes.

Document EP2523008 describes a method for determining the remaining lifetime of a light-emitting diode. This method consists in analysing the variation in the on-state electrical resistance of the light-emitting diode over time. Each on-state resistance is determined by driving the light-emitting diode with two different supply voltages and thus while making two different corresponding currents flow therethrough. The variation in the on-state resistance is considered to be representative of the gradual degradation in light flux. The remaining lifetime of the light-emitting diode is therefore determined depending on the variation in the on-state electrical resistance of the diode while it is turned on.

These methods aim to anticipate a failure mode based on a slow depreciation in flux. In order to ensure that the predicted lifetimes calculated based on this failure mode are accurate, most test standards recommend the calculations of predicted lifetime to be based on measurements carried out after a significant duration of use of a light-emitting diode. According to the IESNA-recommended method TM21-11 used in the LED industry, predicted lifetime cannot be more than 6 times longer than the duration of the reliability test. Typically, for a test lasting 6000 hours, the established maximum lifetime cannot exceed 36000 hours. These predictive calculations are therefore intended to be used to estimate the lifetime before product distribution and not to estimate lifetime during use.

Document WO2007/022409 describes a method for testing light-emitting diodes. The document proposes to carry out functional tests on the light-emitting diodes when they are being turned off. For this purpose, a bridge of switches allows the polarity of a voltage used to drive a light-emitting diode to be inverted. During a test, the potential difference applied across the terminals of the light-emitting diode has the same amplitude as the drive potential difference but the opposite polarity. However, this document does not make it possible to test a light-emitting diode in order to determine its lifetime with a high reliability.

Document EP2523008 proposes to determine the lifetime of a light-emitting diode. For this purpose, this document proposes applying in succession different drive potential differences across the terminals of the light-emitting diode. For these potential differences, the current flowing through the light-emitting diode is measured. The current/voltage characteristics of the light-emitting diode are extrapolated from the measurements, then the ageing of the light-emitting diode is determined from these characteristics.

Document U.S. Pat. No. 6,147,617 describes a method for testing the working order of an advertising display illuminated by light-emitting diodes. This test method delivers a relatively imprecise evaluation of the working order of the light-emitting diodes.

The invention aims to solve one or more of these drawbacks. The invention thus relates to a method for predicting failure of a light-emitting diode, such as defined in the appended claims.

The invention furthermore relates to a lighting device, such as defined in the appended claims.

Other features and advantages of the invention will become more clearly apparent from the completely nonlimiting description given thereof below by way of indication and with reference to the appended drawings, in which.

Another possible failure mode of light-emitting diodes is the increase of leakage currents and non radiative or dark currents. The electrons making up leakage currents do not recombine radiatively in the active zone of the LED. Leakage currents are associated with chip-edge leakage pathways, with leakage pathways in degraded zones of the active zone or with leakage pathways due to surface imperfections. Dark currents correspond to currents that generate heat not light, for example because of defects in the semiconductor. This other failure mode is characterized by abrupt failure of the light-emitting diode.

Figure 2:
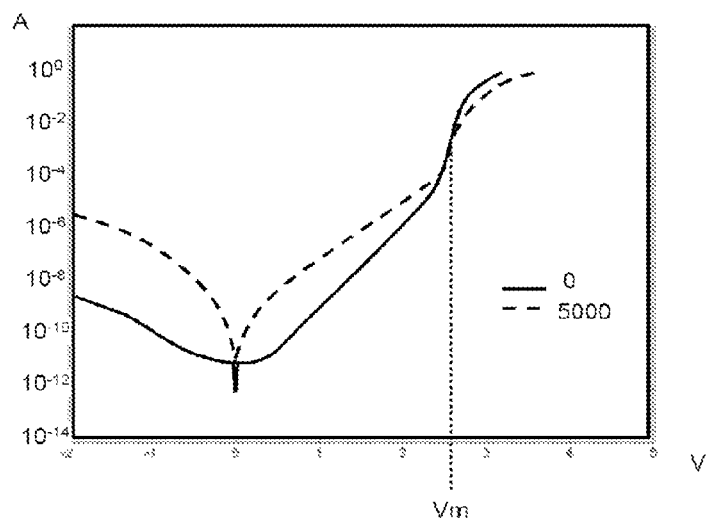
FIG. 2 is a graph illustrating an example of the variation in leakage current from the light-emitting diode as a function of power supply voltage and of time.

FIG. 2 shows a current/voltage graph of an example of light-emitting diode. In the graph, the solid curve defines the current flowing through a light-emitting diode when first used, and the dotted curve defines the current flowing through this light-emitting diode after 5000 hours of driving with a nominal current. The potential difference $V_m$ corresponds to the minimum voltage required to turn on the light-emitting diode. It will be noted, generally, that the current flowing for a bias lower than $V_m$ increases as a function of time.

The invention proposes to apply a test potential difference across the terminals of a light-emitting diode, this test potential difference being lower than the minimum drive potential difference of this light-emitting diode and having the same sign as this minimum drive potential difference. By measuring the current flowing through the light-emitting diode during the application of the test potential difference, it is possible to generate an alarm signal when this current flow exceeds an alarm threshold.

Such a method makes it possible to anticipate future failure of the light-emitting diode in operation with a drive potential difference. Failure is here anticipated not by way of laboratory measurements but by analysing the light-emitting diode in service when is not turned on. Such a result is obtained without there being any need to integrate light sensors.

Figure 1:
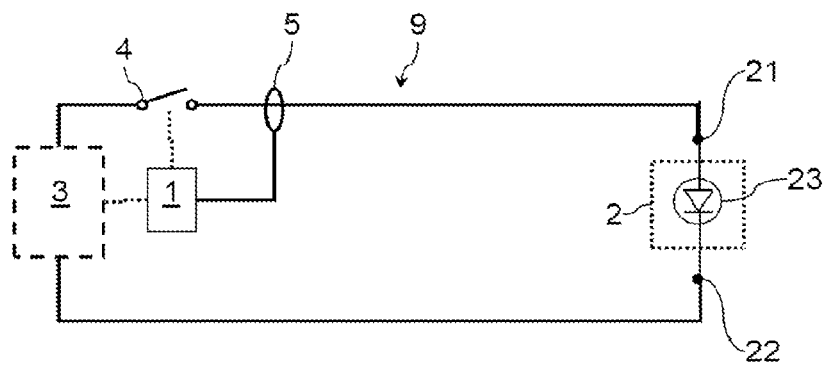
FIG. 1 is a schematic representation of an example of a system for generating an alarm signal when remaining lifetime becomes too low.

FIG. 1 schematically shows a lighting device 9 including a light 2 including at least one light-emitting diode 23. The light-emitting diode 23 may for example be a GaN light-emitting diode. The light-emitting diode 23 may be powered as is known per se by applying a suitable potential difference across the terminals 21 and 22.

The lighting device 9 comprises for this purpose an electrical power supply 3 intended to apply selectively a potential difference across the terminals 21 and 22 of the light-emitting diode 23. The electrical power supply 3 may for example include a converter delivering a DC potential difference to its output and include a voltage source connected to the input of the converter. The electrical power supply 3 is capable of selectively applying to its output, potential differences of various amplitudes, depending on control signals. The electrical power supply 3 is especially capable of applying to its output, on the one hand, a test potential difference lower than the minimum drive potential difference of the light-emitting diode 23 and of the same sign as this minimum drive potential difference, and on the other hand, a potential difference higher than this minimum drive potential difference in order to generate illumination with this light-emitting diode 23.

The lighting device 9 furthermore comprises a circuit 5 for measuring the current flowing between the terminals 21 and 22 of the light-emitting diode 23. The measuring circuit 5 for example comprises a current probe that measures the current in an electrical connection between one of the terminals 21 or 22 and the electrical power supply 3.

The lighting device 9 here optionally comprises a switch 4 allowing the terminal 21 to be selectively isolated from the electrical power supply 3.

The lighting device 9 comprises a control circuit 1. The control circuit 1 is configured to generate a control signal applied to the electrical power supply 3. This control signal defines the level of potential difference applied to the output of the electrical power supply 3. The control circuit 1 is configured to receive a current value measured by the measuring circuit 5. The control circuit 1 is here also configured to control the opening or closing of the switch 4.

The control circuit 1 is especially configured to apply a control signal to the electrical power supply 3, so that the electrical power supply 3 applies a test potential difference $V_t$ across the terminals 21 and 22. By always designating by $V_m$ the minimum drive potential difference of the light-emitting diode 23 (frequently designated by the term threshold voltage in the literature), the test potential difference $V_t$ respects the inequality $V_t<V_m$. $V_m$ is typically about 2.7 V for a blue GaN light-emitting diode. The control circuit 1 receives the current value $I_c$ measured by the measuring circuit 5 during application of the test potential difference $V_t$. The control circuit 1 compares this value $I_c$ to an alarm threshold $I_a$. If $I_c$ exceeds the alarm threshold $I_a$, the control circuit 1 generates an alarm signal. Thus, if $I_c$ exceeds the alarm threshold $I_a$, the amplitude of the leakage currents is deemed to have become significant to the point that it will shortly lead to a noticeable decrease in the light intensity emitted by the light-emitting diode when a drive potential difference is applied. Because the test potential difference $V_t$ used is lower than the minimum drive potential difference, the measured current $I_c$ does not participate in any way to the emission of light from the light-emitting diode 23, and therefore the measured current $I_c$ is "lost" current (sum of the leakage current and dark currents) directly representative of the ageing of this light-emitting diode 23.

The generation of the alarm signal may serve either to initiate a calculation for determining a remaining lifetime of the light-emitting diode 23, or to control a transducer in order to generate a signal perceptible to an operator.

The applied test potential difference $V_t$ has the same sign as the drive potential difference of the light-emitting diode 23. Thus, the measured current flow $I_c$ is representative both of leakage currents and dark currents. The current flow $I_c$ is thus measured under conditions that are very representative of the drive conditions under which a malfunction is liable to occur, contrary to a test potential difference of opposite sign to the drive potential difference. Moreover, a test potential difference of the same sign as the drive potential difference makes it possible to measure a current flow $I_c$ having a relatively high amplitude relative to a test potential of opposite sign to the drive potential difference. The measurement of the current flow $I_c$ is thus much more precise, easy to measure and less sensitive to noise. Moreover, the generation of a test potential difference of the same sign as the drive potential difference makes it possible to use an electrical power supply 3 devoid of an inverter matrix for modifying the polarity of the applied potential difference.

Advantageously, the test potential difference $V_t$ has an amplitude at least equal to 70% of the minimum drive potential difference ($V_m$). Thus, the amplitude of the measured current $I_c$ is higher, thereby making it possible to further increase the precision of the measurement and to get even closer to the drive conditions during the test. Those skilled in the art will also be able to envision applying a lower test potential difference, in order to anticipate even earlier the appearance of a failure.

Advantageously, the test potential difference $V_t$ is at most equal to 90% of the minimum drive potential difference.

The alarm threshold $I_a$ will possibly for example be set as follows: $I_a=n\times I_s$, where $I_s$ is a use current and n a number comprised between 0.1 and 0.4.

The invention may also be implemented in order to predict a remaining duration of use of the light-emitting diode 23, for a given use current. For this purpose, the lighting device 9 (for example the control circuit 1) may memorize a nominal use current $I_n$ of the light-emitting diode and a relationship for the current measured under test as a function of ageing, of the $I_c=f(t)$ type, where t is the length of use of the light-emitting diode 23 at its nominal use current $I_n$.

The control circuit 1 receives the measurement of the current $I_c(t1)$, corresponding to a duration of use t1 at the nominal use current.

From the value $I_c(t_1)$ and the memorized relationship $I_c=f(t)$, it is possible to determine the remaining lifetime T of the light-emitting diode 23 by determining for what value of T $I_c=f(t_1-T)=p\times I_n$, where p is a number advantageously comprised between 0.1 and 0.4. It is then possible to generate an alarm signal when T drops below a threshold. It is for example possible to define p so that $p\times I_n$ is equal to the current flowing through the light-emitting diode for the potential difference $V_m$.

Figure 3:
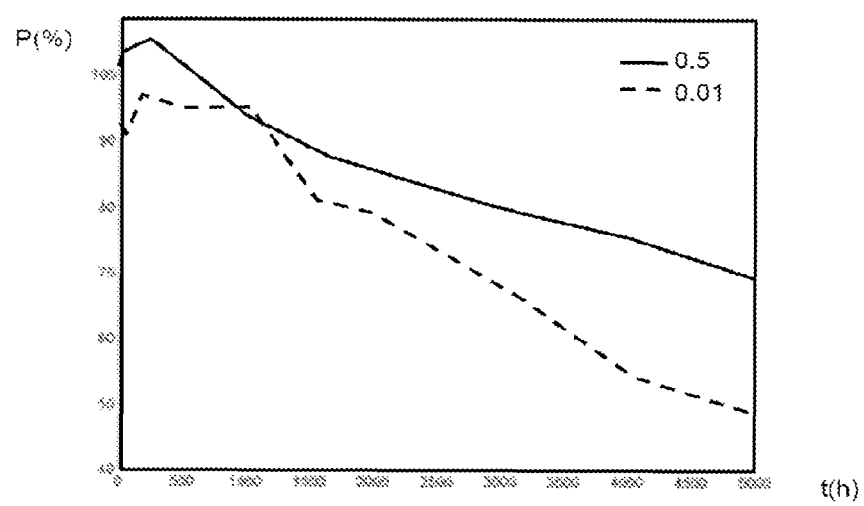
FIG. 3 is a graph illustrating the variation in the optical power emitted by the light-emitting diode as a function of time for various currents.

FIG. 3 illustrates an example of the illumination power (in % of its initial power) of a light-emitting diode as a function of the amount of time for which it has been turned on. The solid curve illustrates the illumination power of the light-emitting diode for a potential difference corresponding to a nominal current of 500 mA. The dotted curve illustrates the illumination power of the light-emitting diode for a potential difference corresponding to a nominal current of 10 mA. It may be seen that the ageing is much more noticeable for low nominal currents.

Using an ageing model (here the variation of the power over time from which $I_c=f(t)$ may be extrapolated) at a given nominal current such as illustrated in FIG. 3 and using the duration t1 determined beforehand, it is also possible to determine a lifetime T after which the illumination power at this nominal current will be lower than a threshold corresponding to a malfunction of the light-emitting diode 21.

The control circuit 1 is typically configured to generate commands, so that the potential difference applied by the power supply 3 in response to these commands corresponds to a nominal current of the light-emitting diode for which an ageing relationship is available.

It is also possible to envision the control circuit 1 memorizing pairs including a current consumed for the test potential difference and the duration of operation of the light-emitting diode 23 at the nominal current. From these memorized pairs, the control circuit 1 will be able to determine a specific relationship $I_c=f(t)$ for the light-emitting diode 23. The determination of such a relationship on the basis of memorized pairs will possibly for example be carried out on the basis of approximations such as the least-squares method, relative to models such as linear-variation, exponential-variation or polynomial models.

Figure 6:
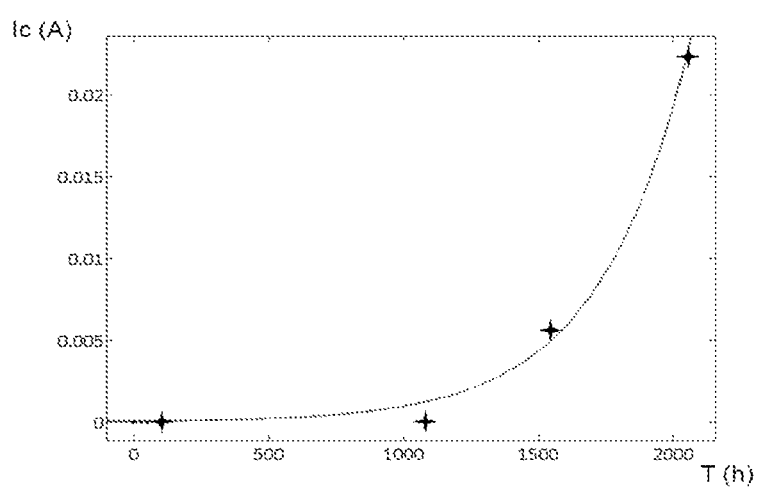
FIG. 6 is a graph of the variation in leakage current as a function of operating time extrapolated from measurements for an example of a light-emitting diode.

FIG. 6 is a graph illustrating both measurement points and an extrapolated curve. The graph illustrates the current $I_c$ as a function of time at a voltage $V_t$ of 2.4 V for the model sold under the reference 'ES 18' by Edison. The time corresponds to a duration of operation at 105° C. at an operating current of 700 mA. The curve is here extrapolated from the measurement points using an exponential function. The extrapolated curve here fits the measured points extremely well, since a coefficient of determination of 0.99 to 1 is obtained.

Figure 7:
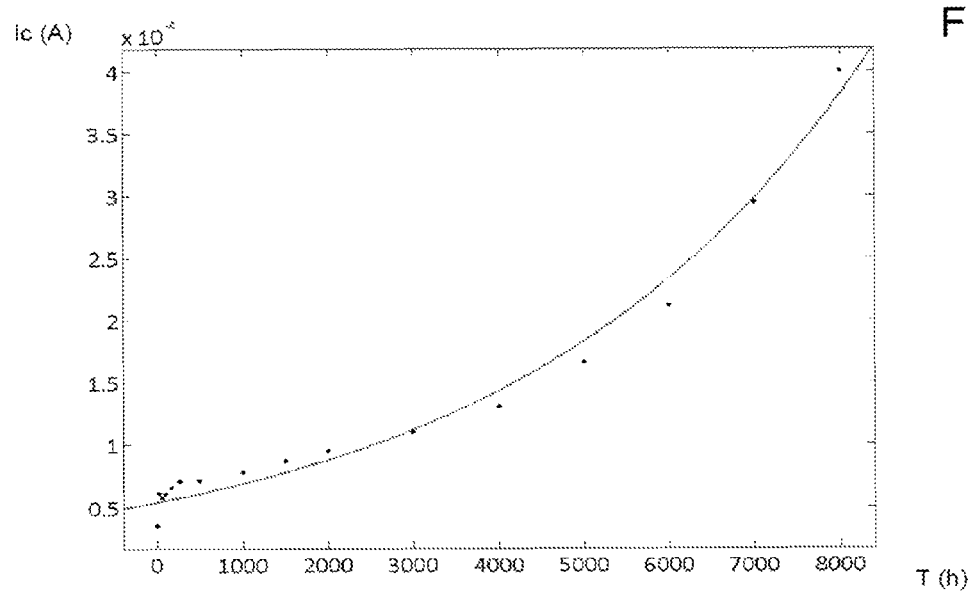
FIG. 7 is a graph of variation in leakage current as a function of operating time extrapolated from measurements for another example of light-emitting diode.

FIG. 7 is another graph illustrating both measurement points and an extrapolated curve, for another light-emitting diode model. The graph illustrates the current $I_c$ as a function of time, at a voltage $V_t$ of 2.4 V, for the model sold under the reference 'Rebel' by Lumileds. The time corresponds to a duration of operation at 80° C. at an operating current of 700 mA. The curve is here extrapolated from the measurement points using an exponential function. The extrapolated curve here fits the measured points extremely well, with a coefficient of determination that is also very high.

Figure 4:
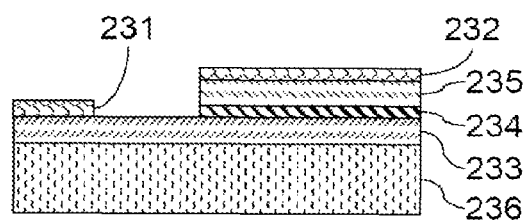
FIG. 4 is a schematic cross-sectional view of an example of common chip light-emitting diode.

FIG. 4 is a cross-sectional view of an example of light-emitting diode. The light-emitting diode is here arranged as is known per se on a GaN layer 236. The light-emitting diode here comprises:
- a layer 233 of n-GaN (for example doped with silicon) arranged on the layer 236;
- an electrode 231 arranged on the layer 233;
- an active layer 234 arranged on the layer 233, to one side of the electrode 231. The active layer 234 generally comprises a stack of $InGa_{(x-1)}N_x$ layers;
- a layer 235 of p-GaN (for example doped with magnesium); and
- an electrode 232 arranged on the layer 235.

Figure 5:
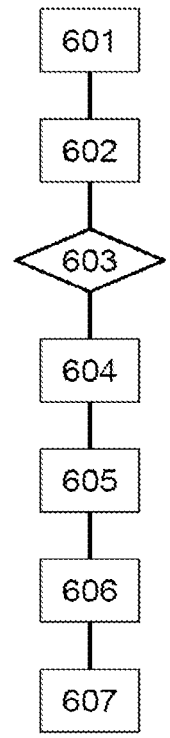
FIG. 5 illustrates various steps of an example of predicting method implemented according to the invention.

The flowchart in FIG. 5 defines various steps of an example of method for predicting failure of a light-emitting diode. In a step 601 a test potential difference is applied across the terminals of a light-emitting diode, said test potential difference being lower than the drive potential of the diode.

In a step 602, the current consumed by the light-emitting diode during the application of the test potential difference is measured.

In a step 603, it is determined whether the measured current exceeds a preset alarm threshold, for example read from a memory.

In a step 604, an alarm signal is generated if the measured current exceeds the preset alarm threshold.

In a step 605, a remaining lifetime is calculated for a nominal drive current of the light-emitting diode.

An ageing relationship of the $I_c=f(t)$ type may be adjusted following measurements carried out on the light-emitting diode, during its lifetime. A new ageing relationship $I_c=f(t_{out})$ may also be memorized following measurements carried out on the light-emitting diode, during its lifetime.

The invention may prove to be particularly advantageous in various applications, for example for the maintenance of installed lights. The alarm signals make it possible for example to intervene to preventively replace lighting devices that are liable to fail.

In the illustrated example, a single light-emitting diode 23 has been illustrated. The invention of course also applies to a light 2 including multiple light-emitting diodes connected as is known per se in series and/or in parallel.

Although the invention proves to be particularly suitable for light-emitting diodes having what is called a "side-emitting" architecture, the invention is applicable to any type of light-emitting diode.

The invention claimed is:

1. A method for predicting failure of a light-emitting diode, comprising:
   applying a test potential difference across terminals of the light-emitting diode that is lower than a minimum drive potential difference of the light-emitting diode, said test potential difference having a same sign as the minimum drive potential difference;
   measuring a current $I_c$ flowing through the light-emitting diode during the application of said test potential difference; and
   upon only one instance of applying said test potential difference and measuring said current $I_c$, generating an alarm signal when the measured current $I_c$ exceeds an alarm threshold $I_a$.

2. The method according to claim 1, wherein said test potential difference has an amplitude at least equal to 70% of the minimum drive potential difference.

3. The method according to claim 1, wherein said test potential difference has a controlled amplitude.

4. The method according to claim 1, further comprising:
   memorizing a nominal use current $I_n$ of the light-emitting diode and an ageing law of $I_c=f(t)$ type, where t is a duration of use of the light-emitting diode at the nominal use current;
   measuring, at an instant $t_1$, a current $I_c(t_1)$ for the test potential difference;
   determining a remaining lifetime T of the light-emitting diode based on a value of T such that $I_c=f(t_1+T)=p \times I_n$, where p is a predefined number comprised between 0.1 and 0.4; and
   generating the alarm signal when the remaining lifetime T drops below a threshold.

5. The method according to claim 4, wherein the current $I_c$ is measured after various durations of use and the ageing law $I_c=f(t)$ is extrapolated and memorized depending on said measured current.

6. The method according to claim 1, wherein the alarm threshold $I_a$ is equal to $n \times I_s$, where $I_s$ is a current flowing through the light-emitting diode for a potential difference greater than the minimum drive potential difference, and n is a number comprised between 0.1 and 0.4.

7. A lighting device, comprising:
   a light-emitting diode;
   an electrical power supply connected across terminals of the light-emitting diode and being configured to selectively apply, across said terminals and depending on a control signal, a potential difference that is greater than a minimum drive potential difference of the light-emitting diode or than a test potential difference that is lower than the minimum drive potential difference, said test potential difference having a same sign as the minimum drive potential difference;
   a first circuit configured to measure a current between the terminals of the light-emitting diode; and
   a second circuit configured to generate a control signal, to control an application of said test potential difference by the electrical power supply, and upon only one instance of applying said test potential difference and measuring said current between the terminals, to generate an alarm signal when the measured current between the terminals of the light-emitting diode for said test potential difference exceeds an alarm threshold.

8. The lighting device according to claim 7, wherein said electrical power supply is configured to apply a DC test potential difference.

9. The lighting device according to claim 8, wherein the first circuit is configured to measure the current for the test potential difference after various durations of use, and to extrapolate and memorize an ageing law of $I_c=f(t)$ type depending on said measured current.

10. The lighting device according to claim 7, wherein said electrical power supply is further configured to apply the test potential difference having a controlled amplitude.

* * * * *